(12) United States Patent
Chen

(10) Patent No.: US 7,427,459 B2
(45) Date of Patent: Sep. 23, 2008

(54) RECTICLE PATTERN APPLIED TO MIX-AND-MATCH LITHOGRAPHY PROCESS AND ALIGNMENT METHOD OF THEREOF

(75) Inventor: Wei-Su Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 210 days.

(21) Appl. No.: 11/533,770

(22) Filed: Sep. 21, 2006

(65) Prior Publication Data

US 2007/0298330 A1    Dec. 27, 2007

(30) Foreign Application Priority Data

Jun. 23, 2006   (TW)   ............................... 95122708 A

(51) Int. Cl.
   *G03F 9/00*   (2006.01)
(52) U.S. Cl. ............................... 430/5; 430/22; 257/797
(58) Field of Classification Search .................. 430/5, 430/22; 257/797
   See application file for complete search history.

(56) References Cited

U.S. PATENT DOCUMENTS 5,952,134 A   9/1999   Hwang

FOREIGN PATENT DOCUMENTS

| JP | 63148627 | 6/1988 |
|---|---|---|
| JP | 9167734 | 6/1997 |
| TW | 508641 | 11/2002 |

*Primary Examiner*—Christopher G Young
(74) *Attorney, Agent, or Firm*—Jianq Chyun IP Office

(57) ABSTRACT

A recticle pattern applied to a mix-and-match lithography process is described. The recticle has a transparent region and a non-transparent region. The transparent region includes a device region and a scribe line region. The recticle pattern includes a plurality of device patterns, a portion of a first and a second set of alignment measure figures, and a set of overlay measure figures. The first and the second sets of the alignment measure figures are disposed on the scribe line region and the non-transparent region. The first and the second sets of the alignment measure figures respectively self-align to produce two sets of composite alignment measure figures after the exposure process. A set of overlay measure figures includes four rectangular boxes respectively disposed in the four areas formed in the corners of where the non-transparent region and the scribe line region meet to correct the overlay error caused by recticle rotation.

17 Claims, 6 Drawing Sheets

126a      126b      126c      126d 128a      128b      128c      128d

RECTICLE PATTERN APPLIED TO MIX-AND-MATCH LITHOGRAPHY PROCESS AND ALIGNMENT METHOD OF THEREOF

CROSS-REFERENCE TO RELATED APPLICATION

This application claims the priority benefit of Taiwan application serial no. 95122708, filed Jun. 23, 2006. All disclosure of the Taiwan application is incorporated herein by reference.

BACKGROUND OF THE INVENTION

1. Field of the Invention

The present invention relates to a recticle pattern of a lithography process and an alignment method thereof. More particularly, the present invention relates to a recticle pattern applied to a mix-and-match lithography process and an alignment method thereof.

2. Description of Related Art

Lithography can be considered as one of the most important steps in the entire semiconductor fabricating process, and all regions related to metal-oxide-semiconductor (MOS) devices, for example, the pattern of each thin film layer and doped regions are determined by the lithography step. However, the line width required in lithography technology has become smaller and smaller along with the increase in the integration of semiconductor IC, so that the commonly used optical lithography technology becomes unable to meet the requirement of the existing process. E-beam lithography technology has to be adopted to further increase the integration of IC. However, e-beam lithography technology has disadvantages such as low throughput even though it can define smaller size of IC.

Accordingly, a mix-and-match lithography technology has been introduced to resolve the problems for developing lithography technology. According to the mix-and-match lithography technology, device patterns are fabricated by combining the optical and the e-beam lithography technology, wherein deep ultra violet ray (DUV) is generally used as the light source in the optical lithography technology. The working theory of the mix-and-match lithography technology is: optical lithography technology is used for processing large size patterns, and e-beam lithography technology is used for processing limited size patterns. Thus, the mix-and-match lithography technology keeps both the high resolution and high integration of e-beam lithography technology and the high throughput of optical lithography technology. However, this mix-and-match lithography technology still has some problems, for example, the problems of inaccurate alignment of the figures between two exposure systems, the design of alignment method and alignment marks.

In addition, some related technologies are disclosed in some patents such as JP 63148627, JP 9167734, TW 508641, and U.S. Pat. No. 5,952,134. All the foregoing documents are used as references by the present disclosure.

SUMMARY OF THE INVENTION

Accordingly, the present invention is directed to provide a recticle pattern applied to a mix-and-match lithography technology for producing alignment marks for DUV optical lithography technology and e-beam lithography technology at the same time, wherein the marks of the two lithography technologies are self-aligned.

According to another aspect of the present invention, an alignment method of a mix-and-match lithography technology is provided to prevent the problems of overlay error expansion or addition and to correct the overlay error caused by recticle rotation.

The present invention provides a recticle pattern applied to a mix-and-match lithography technology. The recticle has a transparent region and a non-transparent region surrounding the transparent region, and the transparent region includes a device region and a scribe line region surrounding the device region. The recticle pattern in the present invention includes a plurality of device patterns, a portion of a first set of alignment measure figures, a portion of a second set of alignment measure figures, and a set of overlay measure figures. Wherein, the device patterns are disposed on the device region. The portion of the first set of the alignment measure figures is disposed on the corresponding scribe line region beside the adjacent non-transparent region. The portion of the second set of the alignment measure figures is disposed beside the portion of the first set of the alignment measure figures and includes a first portion disposed on the corresponding scribe line region adjacent to the non-transparent region and a second portion disposed on the fringe of one of two parallel opposite sides in the non-transparent region. Wherein, the portion of the first set of the alignment measure figures and the portion of the second set of the alignment measure figures respectively self-align to form two sets of composite alignment measure figures on a wafer after an exposure process. In addition, a set of overlay measure figures is used for correcting the overlay error due to recticle rotation. The set of the overlay measure figures includes four rectangular boxes whose transparent regions are of different sizes with a same center after being overlaid, and the boxes are respectively disposed in the four areas formed in the corners of where the non-transparent region and the scribe line region meet. Wherein, the distance between the boxes disposed in the non-transparent region and the edge of the scribe line region is greater than or equal to the distance between the portion of the first set of the alignment measure figures, the portion of the second set of the alignment measure figures and the edge of the scribe line region.

According to an embodiment of the present invention, the first set of the alignment measure figures and the second set of the alignment measure figures are, for example, a coarse alignment mark and a fine alignment mark. Wherein, the coarse alignment mark is, for example, a laser step alignment mark, and the fine alignment mark is, for example, a field image alignment mark.

According to an embodiment of the present invention, the portion of the first set of the alignment measure figures is, for example, a plurality of straight line patterns arranged in parallel, and the straight lines are parallel to the edges of the transparent region and the non-transparent region.

According to an embodiment of the present invention, the first and the second portions in the portion of the second set of the alignment measure figures are, for example, respectively a linear rectangular pattern arranged in parallel, and the linear rectangular patterns are parallel to the edges of the transparent region and the non-transparent region.

According to an embodiment of the present invention, the spaces between the patterns of the first set and the second set of the alignment measure figures may be the same or may be different.

According to an embodiment of the present invention, two sets, three sets, or four sets of overlay measure figures may be further included. Each set of the overlay measure figures includes four rectangular boxes having transparent regions of difference sizes with a same center after being overlaid. The four rectangular boxes are respectively disposed in the four areas formed in the corners of where the non-transparent region and the scribe line region meet, and the boxes in the fourth areas are all different from each other.

The present invention further provides an alignment method of a mix-and-match lithography technology. The alignment method includes the following steps. A recticle having a recticle pattern formed thereon is provided. The recticle has a transparent region and a non-transparent region surrounding the transparent region, and the transparent region includes a device region and a scribe line region surrounding the device region. The recticle pattern includes a plurality of device patterns, a portion of a first set of alignment measure figures, a portion of a second set of alignment measure figures, and a set of overlay measure figures. Wherein, the device patterns are disposed on the device region. The portion of the first set of the alignment measure figures is disposed on the corresponding scribe line region adjacent to the non-transparent region. The portion of the second set of the alignment measure figures is disposed beside the first set of the alignment measure figures and includes a first portion disposed on the corresponding scribe line region adjacent to the non-transparent region and a second portion disposed on the fringe of one of two parallel opposite sides in the non-transparent region. In addition, the set of the overlay measure figures includes four rectangular boxes having transparent regions of different sizes with a same center after being overlaid, and the boxes are respectively disposed in the four areas formed in the corners of where the non-transparent region and the scribe line region meet. Wherein, the distance between the boxes disposed in the non-transparent region and the edge of the scribe line region is greater than or equal to the distance between the portion of the first set of the alignment measure figures, the portion of the second set of the alignment measure figures and the edge of the scribe line region. Next, non-adjacent exposure process is performed to form a plurality of dies on a wafer, and a plurality of cross marks is self-generated between the dies. The portion of the first set of the alignment measure figures and the portion of the second set of the alignment measure figures respectively produce overlaid exposure so that two self-aligned sets of composite alignment measure figures are formed on two adjacent dies. Besides, the four boxes of the set of the overlay measure figures produce overlays in a corner of each die to form a box-in-box pattern for correcting the overlay error caused by recticle rotation.

According to an embodiment of the present invention, the first set and the second set of the alignment measure figures are, for example, a coarse alignment mark and a fine alignment mark. Wherein, the coarse alignment mark is, for example, a laser step alignment mark, and the fine alignment mark is, for example, a field image alignment mark.

According to an embodiment of the present invention, the portion of the first set of the alignment measure figures is, for example, a plurality of straight line patterns arranged in parallel, and the straight lines are parallel to the edges of the transparent region and the non-transparent region.

According to an embodiment of the present invention, the first and the second portions in the portion of the second set of the alignment measure figures are, for example, respectively a linear rectangular pattern arranged in parallel, and the linear rectangular patterns are parallel to the edges of the transparent region and the non-transparent region.

According to an embodiment of the present invention, the spaces between the patterns of the portions of the first set and the second set of alignment measure figures may be the same or may be different.

According to an embodiment of the present invention, two sets, three sets, or four sets of overlay measure figures are further included. Each set of overlay measure figures includes four rectangular boxes having transparent regions of different sizes with a same center after being overlaid, and the four boxes are respectively disposed in the four areas formed in the corners of where the non-transparent region and the scribe line region meet, and the boxes in the four areas are different from each other.

According to an embodiment of the present invention, the exposure process is performed by using a stepper.

According to the present invention, only a portion of the first set of alignment measure figures and a portion of the second set of alignment measure figures are printed on the recticle pattern, thus, the alignment marks required by DUV optical lithography technology and e-beam lithography technology are generated at the same time after performing the non-adjacent exposure process, and the marks of the two exposure systems are self-aligned. Accordingly, the alignment accuracy of the figures between the two exposure systems is improved. Moreover, the recticle pattern in the present invention includes overlay measure figures formed by four rectangular boxes which can be overlaid into a box-in-box pattern for correcting the overlay error caused by recticle rotation after performing the non-adjacent exposure process.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The present invention provides a recticle pattern which can be applied to a mix-and-match lithography process and an alignment method thereof to resolve the problems such as inaccurate alignment of the figures between two exposure systems, the design of alignment method and alignment marks in mix-and-match lithography technology. In the following embodiments, deep ultra violet ray (DUV) optical lithography technology and e-beam lithography technology are used as an example for describing the mix-and-match lithography technology.

Figure 1:
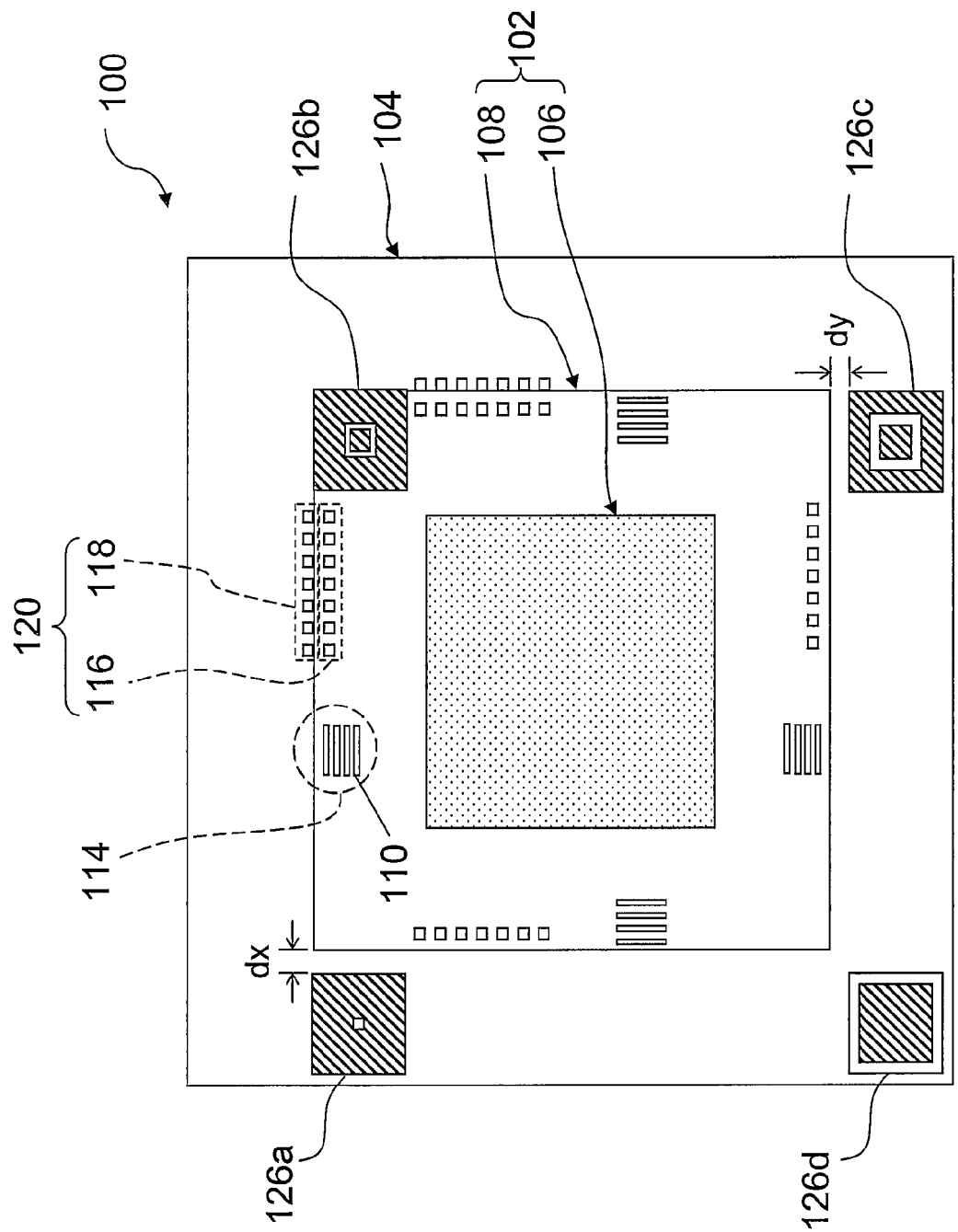
FIG. 1 is a vertical view illustrating a recticle and the pattern thereon according to an embodiment of the present invention.
Figure 2:
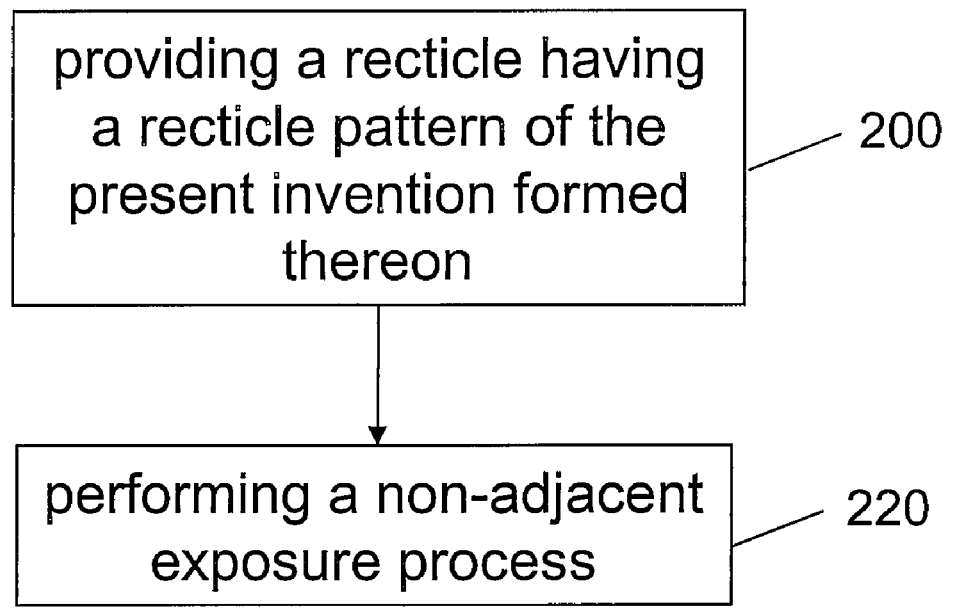
FIG. 2 is a block flowchart illustrating an alignment method for mix-and-match lithography process according to an embodiment of the present invention.

FIG. 1 is a vertical view illustrating a recticle and the pattern thereon according to an embodiment of the present invention. FIG. 2 is a block flowchart illustrating an alignment method for mix-and-match lithography process according to an embodiment of the present invention.

Referring to both FIG. 1 and FIG. 2, in the alignment method for mix-and-match lithography process in the present invention, a recticle 100 having a recticle pattern of the present invention formed thereon is provided first (step 200). The recticle 100 has a transparent region 102 and a non-transparent region 104 surrounding the transparent region 102. The transparent region 102 includes a device region 106 and a scribe line region 108.

Wherein, the device region 106 and the scribe line region 108 on the recticle 100 are generally referred to as dies, and the non-transparent region 104 is covered by a Cr film (not shown). The recticle pattern on the recticle 100 includes a plurality of device patterns (not shown), a portion of a first set of alignment measure figures 114, a portion of a second set of alignment measure figures 120, and a set of overlay measure figures. Wherein, the device patterns on the recticle pattern are disposed on the device region 106 of the transparent region 102.

In addition, the portion of the first set of the alignment measure figures 114 and the portion of the second set of the alignment measure figures 120 are respectively used as the alignment marks required by DUV optical lithography technology. The portion of the first set and the portion of the second set of the alignment measure figures 114 and 120 are parts of the Cr film of the scribe line region 108 formed by etching the Cr film.

In the present embodiment, the first set of the alignment measure figures is used as the fine alignment mark of DUV optical lithography technology, and the second set of the alignment measure figures is used as the coarse alignment mark of DUV optical lithography technology. Wherein, the fine alignment mark is, for example, a field image alignment mark (FIA mark), which is formed by, for example, nine straight line patterns, and the center of the $5^{th}$ line among the nine straight line patterns is used as the center of the alignment mark. The coarse alignment mark is, for example, laser step alignment mark (LSA mark), which is formed by, for example, three rectangular patterns arranged linearly, and the center of the middle rectangular pattern is used as the center of the alignment mark.

However, the recticle pattern of the present invention only includes "a portion of" the first set of the alignment measure figures and "a portion" of the second set of the alignment measure figures. The portion of the first set of the alignment measure figures 114 is, for example, 4 straight line patterns 110 formed on the corresponding scribe line region 108 adjacent to the non-transparent region 104; the portion of the second set of the alignment measure figures 120 is, for example, a rectangular pattern 116 arranged linearly formed on the corresponding scribe line region 108 adjacent to the non-transparent region 104, and a rectangular pattern 118 arranged linearly formed on the fringe of one of two parallel opposite sides in the non-transparent region 104.

Certainly, the number and the shape of the patterns of the portion of the first set and the portion of the second set of the alignment measure figures 114 and 120 are not specified particularly in the present invention. Moreover, in an embodiment, the spaces of the patterns of the portion of the first set and the portion of the second set of the alignment measure figures 114 and 120 may be the same. In another embodiment, the spaces of the patterns of the portion of the first set and the portion of the second set of alignment measure figures 114 and 120 may be different.

Figure 4:
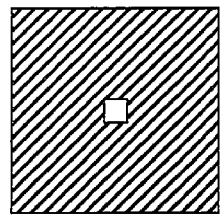
FIG. 4 and FIG. 5 are diagrams illustrating the overlay measure figures according to an embodiment of the present invention.
Figure 4:
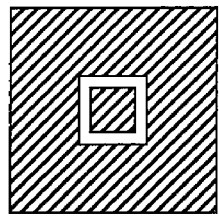
Figure 4:
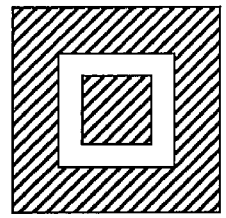
Figure 4:
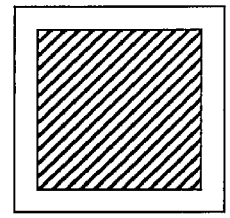
Figure 5:
Figure 5:
Figure 5:
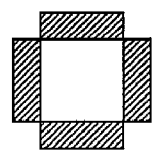
Figure 5:
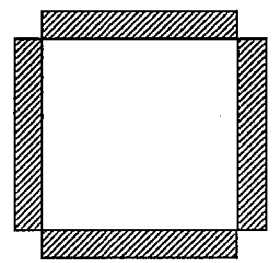

Besides, a set of overlay measure figures on the recticle pattern of the present invention is formed by four rectangular boxes having transparent regions of different sizes with a same center after being overlaid. The four rectangular boxes are, for example, the rectangular boxes 126a, 126b, 126c, and 126d in FIG. 4, or the rectangular boxes 128a, 128b, 128c, and 128d in FIG. 5, wherein the oblique lines in the boxes are non-transparent regions, and the blank parts are transparent regions. Certainly, the set of overlay measure figures in the present invention is not limited to what shown in FIG. 4 and FIG. 5, and any set of overlay measure figures which have the same center after being overlaid can be used as the set of overlay measure figures in the present invention. In the present embodiment, the rectangular boxes 126a, 126b, 126c, and 126d in FIG. 4 are described as an example of the set of overlay measure figures on the recticle pattern, and the rectangular boxes 126a, 126b, 126c, and 126d are respectively disposed in the four areas formed in the corner of where the non-transparent region 104 and the scribe line region 108 meet (as shown in FIG. 1). Besides, the distance between the rectangular boxes on the non-transparent region 104 and the edge of the scribe line region 108 is greater than or equal to the distance between the rectangular pattern 118 arranged linearly and the edge of the scribe line region 108.

Figure 6:
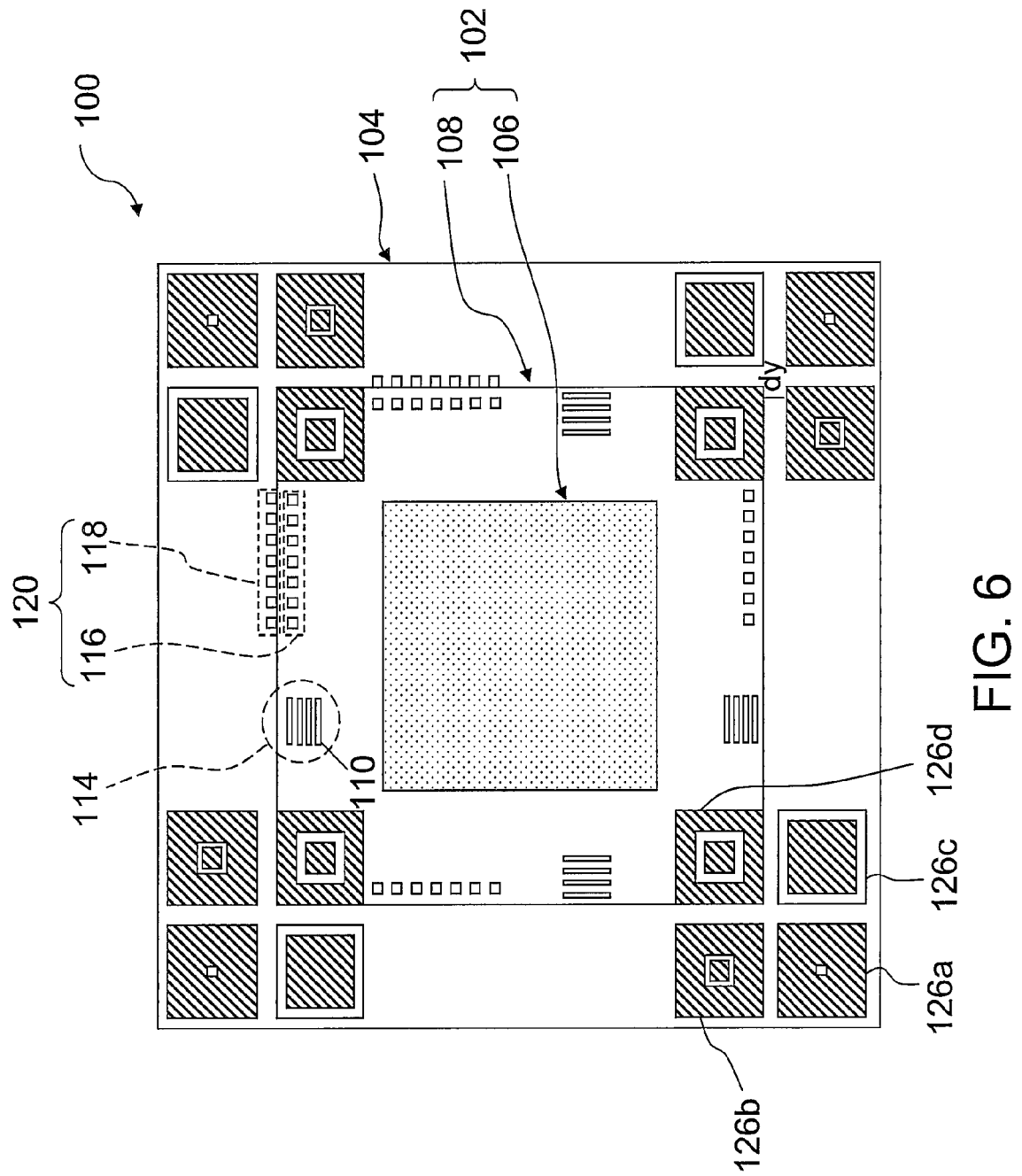
FIG. 6 is a vertical view of a recticle and the pattern thereon according to another embodiment of the present invention.

In another embodiment, for example, two sets (not shown), three sets (not shown), or four sets of overlay measure figures (as shown in FIG. 6) may also be disposed on the recticle pattern of the present invention, wherein the rectangular boxes in the four areas formed in the corners of where the non-transparent region 104 and the scribe line region 108 meet are all different.

Next, referring to FIG. 2 again, a non-adjacent exposure process is performed (step 220), which refers to that die-to-die is not pressed together to be exposed when the exposure process for printing the recticle pattern onto the wafer is performed, instead, a gap is preserved. Wherein, the width of the preserved gap is the same as the line width of the first set DUV optical alignment mark straight line figure and the width of rectangular pattern used by the second set of DUV optical alignment mark.

Figure 3:
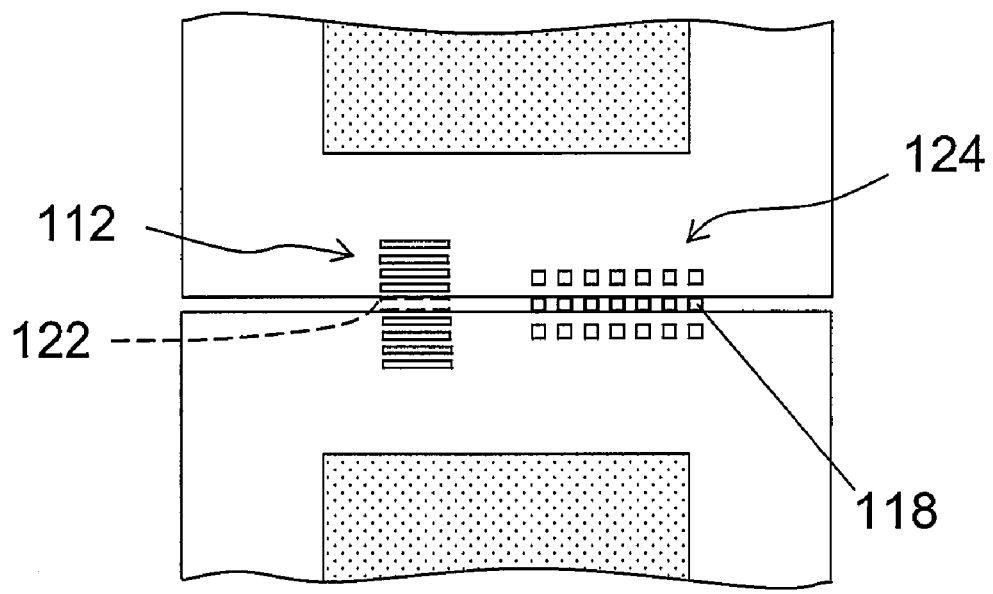
FIG. 3 is a vertical view illustrating the composite alignment measure figures on a wafer according to an embodiment of the present invention.

The recticle pattern of the present invention includes only a portion of the first set of the alignment measure figures 114 and a portion of the second set of the alignment measure figures 120. Thus, the non-adjacent exposure process allows the portion of the first set of the alignment measure figures 114 to self-generate nine composite straight line patterns 122 on the wafer (as shown in FIG. 3) shared by the two adjacent dies after the non-adjacent exposure process has been performed to the two adjacent dies, and a straight line pattern 112 formed on the non-transparent region 104 is defined by the gap preserved between the two dies. In specific, the line width defined by the gap between the two dies is the same as the four line widths of the portion of the first set of the alignment measure figures 114 on the transparent region, that is, the line widths of the nine straight line figures of the complete first set of the alignment measure figures combined by the two dies are all the same. In addition, only a portion of the straight line pattern 112 is illustrated in FIG. 3, and actually the length of the straight line figure in the middle (i.e. the straight line pattern 112) is the side length of the die, which is longer than the lengths of the four straight line figures at each side.

Similarly, the two adjacent dies allow the rectangular pattern 118 arranged linearly of the portion of the second set of the alignment measure figures 120 on the non-transparent region 104 to be exposed overlappedly, so that three composite rectangular patterns 124 arranged linearly are self-generated on the wafer (as shown in FIG. 3), and the rectangular pattern 118 arranged linearly on the non-transparent region 104 is defined by the gap preserved between the two dies. The spacing of the non-adjacent exposure is the same as the line width of the rectangular pattern 118 arranged linearly, and the line width can be measured in the direction perpendicular to the edge of the die. The nine straight line patterns and the three rectangular patterns arranged linearly are the composite set of alignment measure figures on the wafer, which can be respectively used as the fine alignment mark and the coarse alignment mark required by DUV optical lithography technology.

Figure 7:
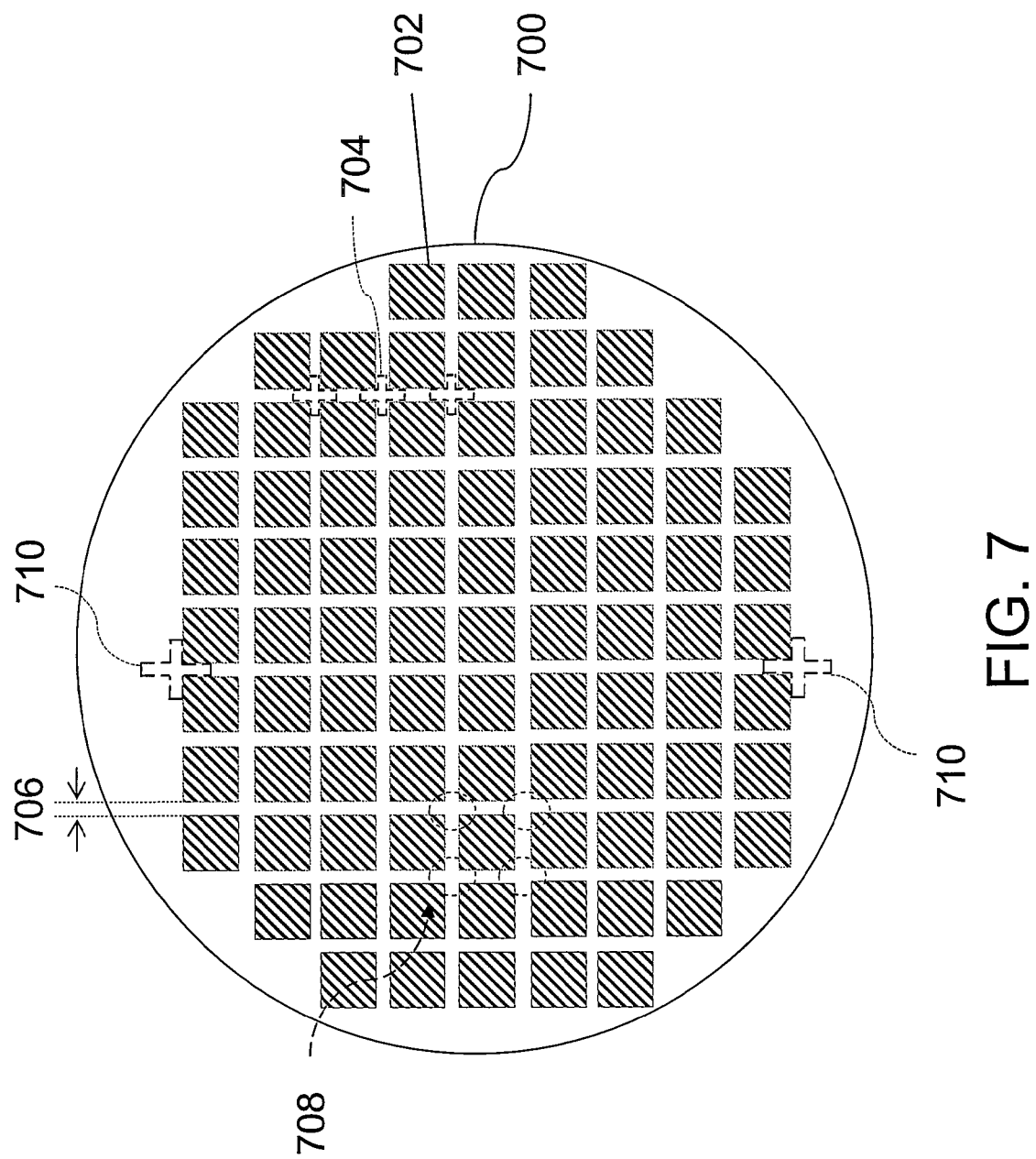
FIG. 7 is a vertical view of a wafer after non-adjacent exposure process according to an embodiment of the present invention.

The foregoing exposure process is performed by using, for example, a stepper. Referring to FIG. 7, the exposing method is to preserve a gap 706 between the dies so as to form a plurality of exposing regions 702 on a wafer 700, and a plurality of cross marks 704 are self-generated between the exposing regions 702. The center of the cross marks 704 is the center of the line widths, thus, the cross marks 704 can be used as the fine alignment chip cross mark (as 708 shown in FIG. 7) required for aligning by e-beam lithography technology, and any two fine alignment chip cross marks can be used as the coarse alignment global cross mark (as 710 shown in FIG. 7) required for aligning by e-beam lithography technology.

Moreover, according to the exposing method, two self-aligned composite sets of alignment measure figures (the nine straight line patterns 122 and the three rectangular patterns 124 arranged linearly in FIG. 3) can also be formed on two adjacent exposing regions on the wafer. The centers of the first set and the second set of DUV optical alignment marks can be aligned by performing the non-adjacent exposure process, and meanwhile the foregoing centers can be self-aligned with the center of the cross mark required for e-beam alignment; the three centers are aligned on the same straight line.

Accordingly, in the present invention, besides generating the marks required for aligning by e-beam lithography technology and the marks required for aligning by DUV lithography technology at the same time, the marks of the two exposure systems can be self-aligned to improve the alignment accuracy of the figures between the two exposure systems and to prevent expansion or addition of overlay errors. Moreover, the foregoing self-alignment process is suitable for inside-layer mix-and-match exposure technology and inter-layer mix-and-match exposure technology, thus, the process can be applied to optical to optical or optical to e-beam mix-and-match lithography technology. On the other hand, according to the present invention, it is not necessary to print any mark (cross mark) required for aligning by e-beam lithography technology on the device region or the scribe line region of the recticle, thus, the printing time and the surface area of the recticle can be reduced.

Figure 8:
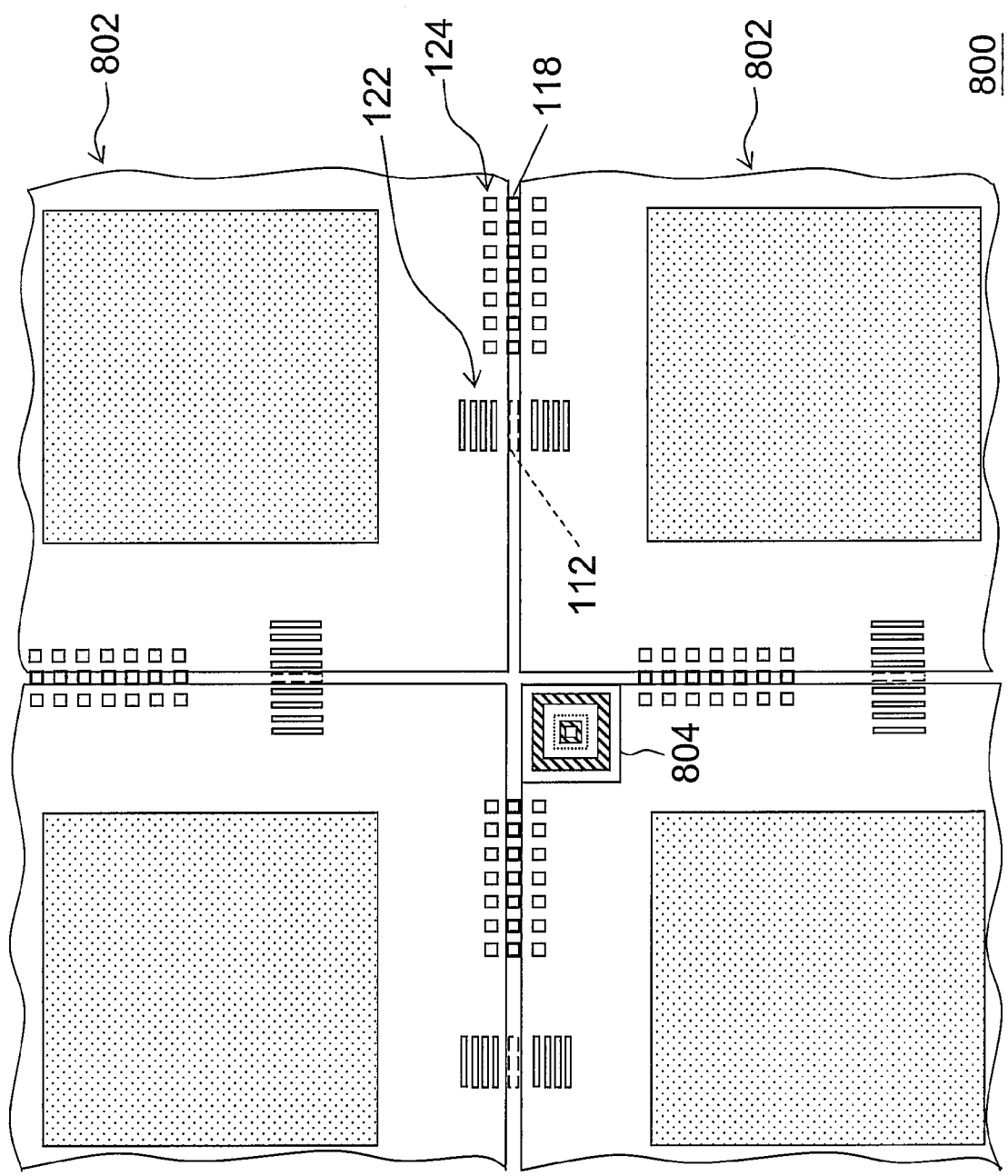
FIG. 8 is a vertical view of a plurality of dies after non-adjacent exposure process according to an embodiment of the present invention.

Moreover, referring to FIG. 8, after performing a non-adjacent exposure process in step 220, the four rectangular boxes 126a, 126b, 126c, and 126d of the set of the overlay measure figures on the recticle pattern overlay in a corner of the exposing region 802 on the wafer 800, so as to form a box-in-box pattern 804. In an embodiment, if there are four overlay measure figures on the recticle pattern, overlays will be produced in the four corners of the exposing region on the wafer, so as to form four box-in-box pattern (not shown).

The foregoing box-in-box pattern can be used as the figure for measuring recticle rotation error between dies, and the measuring method is to shift the exposed wafer to an image comparing machine to measure the offsets of the box-in-box pattern in horizontal and vertical directions and to correct the overlay error caused by recticle rotation with the offset values. Wherein, the image comparing machine used in the present invention is, for example, KLA 5XXX machine.

In overview, according to the present invention, the recticle pattern and the alignment method for mix-and-match lithography process using the recticle pattern have at least the following advantages:

1. In the present invention, the marks required for aligning by DUV optical lithography technology and e-beam lithography technology can be generated at the same time, and the marks of two exposure systems can be self-aligned. Thus, the alignment accuracy of the figures between two exposure systems can be improved.

2. The fine alignment mark and coarse alignment mark self-generated by DUV optical lithography technology can be self-aligned, and meanwhile the fine alignment mark and coarse alignment mark can self-align with the cross marks of e-beam lithography technology, thus, the problem of expansion or addition of overlay error can be prevented.

3. In the present invention, the overlay measure figures are formed with the four areas constructed in the corners of where the non-transparent region and the scribe line region meet, and a box-in-box pattern is formed after exposure process is performed to correct the overlay error produced by recticle rotation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A recticle pattern applied to a mix-and-match lithography process, the recticle having a transparent region and a non-transparent region surrounding the transparent region, the transparent region comprising a device region and a scribe line region surrounding the device region, the recticle pattern comprising:

a plurality of device patterns, disposed on the device region;

a portion of a first set of alignment measure figures, disposed on the corresponding scribe line region adjacent to the non-transparent region;

a portion of a second set of alignment measure figures, disposed beside the portion of the first set of the alignment measure figures, comprising a first portion disposed on the corresponding scribe line region adjacent to the non-transparent region and a second portion disposed on the fringe of one of the two parallel opposite sides in the non-transparent region, wherein a portion of the first set and a portion of the second set of the alignment measure figures self-align after an exposure process to self-generate two sets of composite alignment measure figures on a wafer; and a set of overlay measure figures, used for correcting the overlay error produced by recticle rotation, the set of the overlay measure figures comprises four rectangular boxes having transparent regions of different sizes with a same center after being overlaid, and the four boxes being respectively disposed in four areas formed in the corners of where the non-transparent region and the scribe line region meet, Wherein the distance between the boxes disposed in the non-transparent region and the edge of the scribe line region is greater than or equal to the distance between the portion of the first set of the alignment measure figures, the portion of the second set of the alignment measure figures and the edge of the scribe line region.

2. The recticle pattern as claimed in claim 1, wherein the first set and the second set of the alignment measure figures comprise a coarse alignment mark and a fine alignment mark.

3. The recticle pattern as claimed in claim 2, wherein the coarse alignment mark comprises a laser step alignment mark.

4. The recticle pattern as claimed in claim 2, wherein the fine alignment mark comprises a field image alignment mark.

5. The recticle pattern as claimed in claim 1, wherein the portion of the first set of the alignment measure figures comprises a plurality of straight line patterns arranged in parallel, and the straight lines are parallel to the edges of the transparent region and the non-transparent region.

6. The recticle pattern as claimed in claim 1, wherein the first and the second portions in the portion of the second set of the alignment measure figures respectively comprise a linear rectangular pattern arranged in parallel, and the linear rectangular patterns are parallel to the edges of the transparent region and the non-transparent region.

7. The recticle pattern as claimed in claim 1, wherein the spaces between the patterns of the portion of the first set and the portion of the second set of the alignment measure figures may be the same or may be different.

8. The recticle pattern as claimed in claim 1 further comprising two sets, three sets, or four sets overlay measure figures, each set of the overlay measure figures comprises four rectangular boxes having transparent regions of different sizes with a same center after being overlaid, and the four boxes are respectively disposed in the four areas formed in the corners of where the non-transparent region and the scribe line region meet, the rectangular boxes in the four areas are all different from each other.

9. An alignment method of a mix-and-match lithography process, comprising:
   providing a recticle with a recticle pattern formed thereon, the recticle having a transparent region and a non-transparent region surrounding the transparent region, the transparent region comprising a device region and a scribe line region surrounding the device region, the recticle pattern comprising:
   a plurality of device patterns, disposed on the device region;
   a portion of a first set of alignment measure figures, disposed on the corresponding scribe line region adjacent to the non-transparent region;
   a portion of a second set of alignment measure figures, disposed beside the portion of the first set of the alignment measure figures, comprising a first portion disposed on the corresponding scribe line region adjacent to the non-transparent region and a second portion disposed on the fringe of one of the two parallel opposite sides in the non-transparent region; and
   a set of overlay measure figures, comprising four rectangular boxes having transparent regions of different sizes with a same center after being overlaid, and the four boxes being respectively disposed in four areas formed in the corners of where the non-transparent region and the scribe line region meet,
   Wherein the distance between the boxes disposed in the non-transparent region and the edge of the scribe line region is greater than or equal to the distance between the portion of the first set of the alignment measure figures, the portion of the second set of the alignment measure figures and the edge of the scribe line region; and
   performing a non-adjacent exposure process to form a plurality of dies on a wafer, a plurality of cross marks being self-generated between the dies,
   the portion of the first set and the portion of the second set of the alignment measure figures forming two self-aligned sets of composite alignment measure figures on two adjacent dies,
   the four rectangular boxes of the set of overlay measure figures being overlaid in a corner of each of the dies to form a box-in-box pattern for correcting the overlay error produced by recticle rotation.

10. The alignment method as claimed in claim 9, wherein the first set and the second set of the alignment measure figures comprise a coarse alignment mark and a fine alignment mark.

11. The alignment method as claimed in claim 10, wherein the coarse alignment mark comprises a laser step alignment mark.

12. The alignment method as claimed in claim 10, wherein the fine alignment mark comprises a field image alignment mark.

13. The alignment method as claimed in claim 9, wherein the portion of the first set of the alignment measure figures comprises a plurality of straight line patterns arranged in parallel, and the straight lines are parallel to the edges of the transparent region and the non-transparent region.

14. The alignment method as claimed in claim 9, wherein the first and the second portions in the portion of the second set of the alignment measure figures respectively comprise a linear rectangular pattern arranged in parallel, and the linear rectangular patterns are parallel to the edges of the transparent region and the non-transparent region.

15. The alignment method as claimed in claim 9, wherein the spaces between the patterns of the portion of the first set and the portion of the second set of the alignment measure figures are the same or are different.

16. The alignment method as claimed in claim 9 further comprising two sets, three sets, or four sets of overlay measure figures, each set of the overlay measure figures comprises four rectangular boxes having transparent regions of different sizes with a same center after being overlaid, and the four boxes are respectively disposed in the four areas formed in the corners of where the non-transparent region and the scribe line region meet, the rectangular boxes in the four areas are all different from each other.

17. The alignment method as claimed in claim 9, wherein the exposure process is performed by using a stepper.

* * * * *